US006408014B1

(12) United States Patent
Ackerman et al.

(10) Patent No.: US 6,408,014 B1
(45) Date of Patent: Jun. 18, 2002

(54) APPARATUS AND METHOD FOR STABILIZING THE FREQUENCY OF A LIGHT SOURCE

(75) Inventors: David A. Ackerman, Hopewell; John E. Johnson, New Providence, both of NJ (US)

(73) Assignee: Agere Systems Guardian Corp., Berkeley Heights, NJ (US)

( * ) Notice: Subject to any disclaimer, the term of this patent is extended or adjusted under 35 U.S.C. 154(b) by 0 days.

(21) Appl. No.: 09/348,549

(22) Filed: Jul. 7, 1999

(51) Int. Cl.[7] ................................. H01S 3/13
(52) U.S. Cl. ............... 372/32; 372/45; 372/50; 372/96; 372/26; 372/64
(58) Field of Search ............... 372/50, 32, 20, 372/45, 96, 64, 26; 250/227.21; 359/237; 257/185

(56) References Cited

U.S. PATENT DOCUMENTS

| 4,751,710 | A | * | 6/1988 | Yamaguchi et al. ........... 372/50 |
| 5,227,648 | A | * | 7/1993 | Woo ........................... 257/185 |
| 5,401,957 | A | * | 3/1995 | Suzuki et al. ........... 250/227.21 |
| 6,064,681 | A | * | 5/2000 | Ackerman .................... 372/32 |
| 6,222,861 | B1 | * | 4/2001 | Kuo et al. .................... 372/20 |
| 6,233,082 | B1 | * | 5/2001 | Johnson ....................... 359/237 |
| 6,233,263 | B1 | * | 5/2001 | Chang-Hasnain et al. .... 372/32 |

* cited by examiner

Primary Examiner—Leon Scott, Jr.
(74) Attorney, Agent, or Firm—Stroock & Stroock & Lavan LLP

(57) ABSTRACT

A monolithically integrated light source and frequency discriminator has a section in which a single frequency optical signal is produced and a section in which the frequency is sensed. The output of the optical discriminator is connected to a controller for stabilizing the output frequency of the light source.

30 Claims, 4 Drawing Sheets

APPARATUS AND METHOD FOR STABILIZING THE FREQUENCY OF A LIGHT SOURCE

FIELD OF THE INVENTION

This invention relates generally to the field of high speed optical sources for dense wavelength division multiplexed (DWDM) transmission systems, and specifically to a monolithically integrated light source and frequency discriminator.

BACKGROUND OF INVENTION

The explosive growth in internet, multimedia and wireless traffic in recent years is rapidly exhausting capacity in public networks worldwide, forcing network service providers to aggressively install new lines and upgrade old ones. However, technological breakthroughs have made all-optical DWDM systems a cost-effective way to utilize the vast bandwidth already available in the embedded fiber plant.

Externally modulated lasers of either the monolithically integrated or hybrid type are high speed optical sources favored for DWDM transmission systems. DWDM based transmission systems increase the information carrying capacity of a transmission system by loading multiple channels of differing optical frequencies onto a single optical fiber. As the number of channels in a DWDM system increases in a given amplifier bandwidth, the channel spacing decreases. Over the last three years, the channel density of commercial DWDM systems has increased dramatically. As a result, the narrower frequency spacing between channels has become susceptible to long-term aging-induced frequency drifts of conventional optical sources as known in the art. Consequently to ensure that optical signals do not wander out of their allotted channel bands, and moreover, to ensure the proper performance of narrow band passive optical components which perform functions such as adding or dropping channels, optical sources must possess a high degree of frequency stability. For these reasons, frequency stabilization has become a necessary part of a DWDM transmission system.

There are several schemes for achieving the frequency stabilization of optical sources known in the art. These include the use of absolute reference cells containing vases with well defined atomic or molecular transitions, calibrated reference elements such as fiber-gratings. Fabry-Perot (FP) etalons or waveguide interferometers, and monolithically integrated reference elements such as a Distributed Feed-Back (DFB) or Distributed Bragg Reflector (DBR) gratings. While these prior art schemes for the frequency stabilization of optical sources work for their intended purpose, they have significant drawback in that they are costly, not compact in size, not easy to use and do not provide the level of frequency stable, low chirp, optical signals that are required for DWDM transmission systems today and the future.

Monolithically integrated reference elements such as DUB or DBR gratings are capable of providing a single frequency optical output signal as known in the art. DFB lasers operate in a single optical mode in contrast to multi-longitudinal mode Fabry-Perot (FP) lasers. Reference is first made to FIG. 1 which depicts the optical cavity 10 of a DFB laser constructed in accordance with the prior art. DFB laser optical cavity 10 is contained within a DFB back facet 15 and a DFB front facet 16. A DFB waveguide 14 and a Bragg grating 13 extend from DFB back facet 15 to DFB front facet 16. Bragg grating 13 is a diffraction grating that provides frequency selective feedback to photons in DFB optical cavity 10. DFB optical cavity 10 is connected to a DFB signal source 11 which is generally used to pass a DC current through DFB optical cavity 10 so as to emit light in DFB waveguide 14 as known in the art. DFB optical cavity 10 is grounded by a DFB ground connection 12. A DFB output signal 18 is produced from DFB front facet 16 as known in the art. Although, a DFB laser can provide a single frequency optical signal output, it does not provide a stable frequency that is desired in a DWDM transmission system today.

An electro-absorption modulated laser (EML) is capable of providing a single frequency, high speed, low chirp optical signal output as known in the art. Reference is now made to FIG. 2 which depicts the body 20 of an EML constructed in accordance with the prior art. EMIT 20 has a modulator 19 which is connected to DFB optical cavity 10. Specifically, modulator 19 has a modulator waveguide 24 which can be constructed of substantially the same material as that used for at DFB laser waveguide as known in the art. Modulator 19 also has a modulator back side 25 and a modulator front side 26 such that modulator waveguide extends from modulator back side 25 to modulator front side 26. A modulator signal source 21 provides a signal to modulator 19. EML optical cavity 20 is grounded by an EML ground connection 22. Modulator back side 25 is connected to DFB front side 16 such that modulator waveguide 24 and DFB waveguide 14 are aligned and coextensive. An EML output signal 28 is produced from modulator front side 26 as known in the art. Although, an EML can provide a single frequency, high speed, low chirp optical signal output, it does not provide a stable frequency that is desired in a DWDM transmission system today. Thus, it is desirable to provide for a better scheme for the frequency stabilization of optical sources which is a balance of performance, reliability and cost which provides for a high speed, low chirp, single stable frequency optical source for DWDM transmission systems.

SUMMARY OF THE INVENTION

The present invention is directed at overcoming shortcomings in the prior art. Generally speaking, in accordance with the present invention, a monolithically integrated light source and frequency discriminator has a section which produces a single frequency optical signal and a section which senses the optical frequency. The light producing section comprises an active material in which an electrical signal is converted to an optical signal. A portion of the optical signal is coupled to the frequency discriminator which comprises at least two photodetectors arranged to sense the optical frequency. The outputs of the photodetectors are connected to a controller comprising a microprocessor, discrete electronics or some combination thereof, for stabilizing the optical frequency of the light source at a desired value.

In a preferred embodiment, a monolithically integrated electro-absorption modulated laser (EML) and frequency discriminator has a distributed feedback laser having a back side and a front side. A modulator is connected to the front side of the distributed feedback laser such that the modulator and the distributed feedback laser form an EML which has an output signal with an EML output frequency. Further, a two element photodetector array is connected to the back side of the distributed feedback laser such that the photodetector array can sense the EML output frequency. The photodetector is connected to controller to stabilize the EML output frequency.

Other objects and features of the present invention will become apparent from the following detailed description, considered in conjunction with the accompanying drawing figures. It is to be understood, however, that the drawings, which are not to scale, are designed solely for the purpose of illustration and not as a definition of the limits of the invention, for which reference should be made to the appended claims.

BRIEF DESCRIPTION OF THE DRAWINGS

In the drawing figures, which are not to scale, and which are merely illustrative, and wherein like reference numerals depict like elements throughout the several views.

DETAILED DESCRIPTION OF THE PREFERRED EMBODIMENTS

Figure 1:
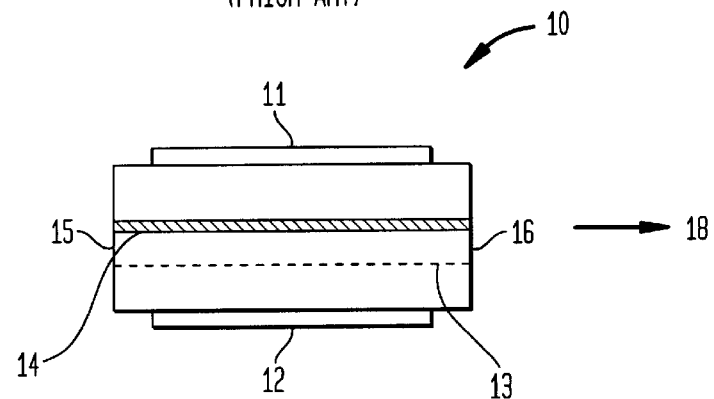
FIG. 1 is a side cross sectional view of the optical cavity of a DFB laser constructed in accordance with the prior art.
Figure 2:
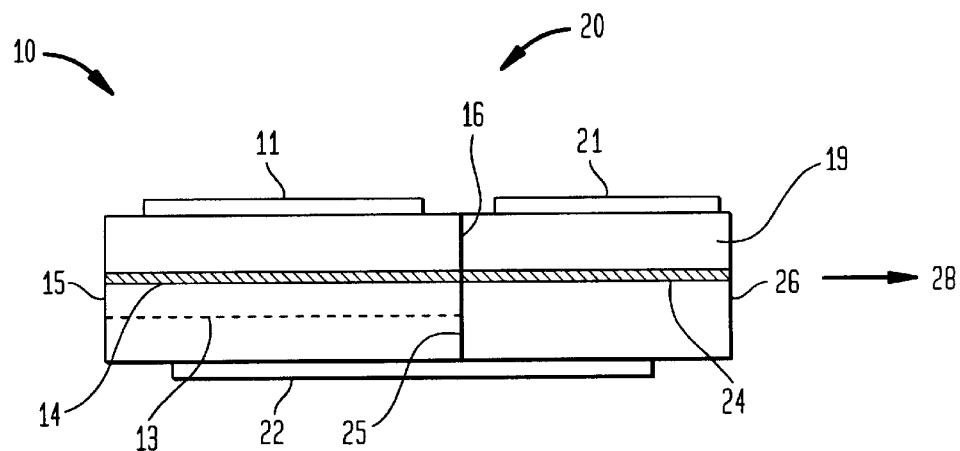
FIG. 2 is a side cross sectional view of the optical cavity of an EML constructed in accordance with the prior art.
Figure 3A:
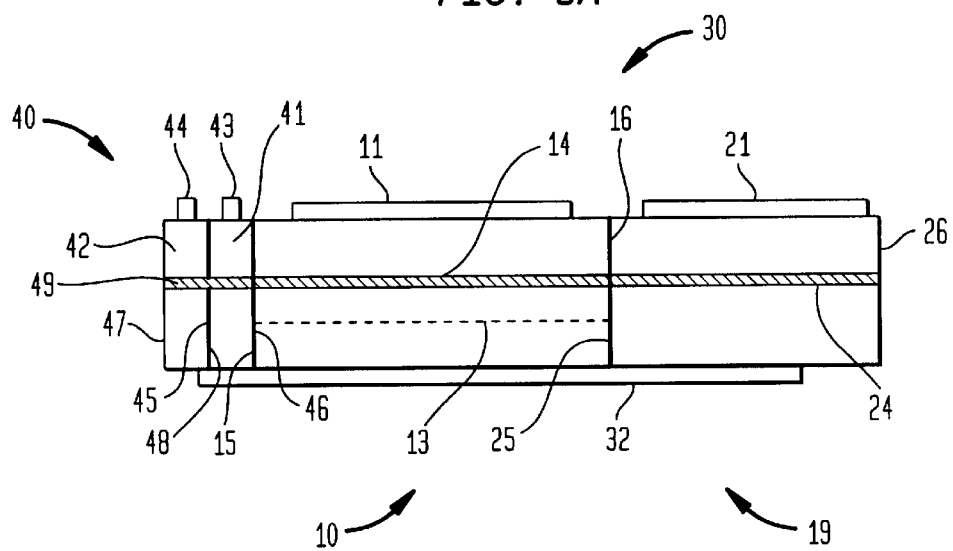
FIG. 3A is a side cross sectional view of the optical cavity of a monolithically integrated EML and frequency discriminator constructed in accordance with a preferred embodiment of the present invention.
Figure 3B:
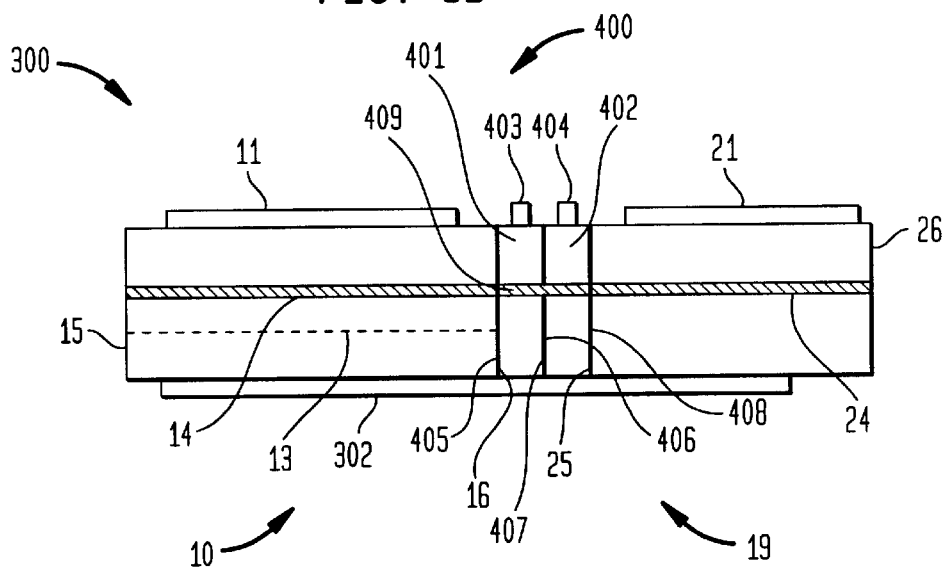
FIG. 3B is a side cross sectional view of the optical cavity of a monolithically integrated EML and frequency discriminator constructed in accordance with a second embodiment of the present invention.

Reference is now made to FIG. 3A which illustrates the optical cavity of a monolithically integrated EML and frequency discriminator (EMLFD) of the present invention, generally indicated as 30. EMLFD 30 has a modulator 19 connected to a single frequency light source 10, such as, for example, a DFB optical cavity 10, as known in the art. Additionally, EMLFD 30 also has a two element photodetector 40, as known in the art, which is connected to DFB back side 15. Photodetector 40 consists of a first detector 41 and a second detector 42. EMLFD 30 is grounded by an EMLFD ground connection 32.

First detector 41 has a first detector back side 45 and a first detector front side 46. Similarly, second detector 42 has a second detector back side 47 and a second detector front side 48. Photodetector 40 is formed such that first detector back side 45 of first detector 41 is connected to second detector front side 48 of second detector 42. This connection between first detector 41 and second detector 42 is one wherein the two detectors are electrically isolated from one another. First detector front side 46 of first detector 41 is connected to DFB back side 15 of DFB laser optical cavity 10.

Photodetector 40 also has a photodetector waveguide 49 which can be constructed of the same material as that used for DFB waveguide 14 and modulator waveguide 24. Preferably, although not necessarily, a multiquantum well (MQW) buried heterostructure as known in the art is used. Alternatively, photodetector waveguide 49 could be constructed of a material different from DFB waveguide 14 and modulator waveguide 24. By way of non-limiting example, a bulk active material as known in the art could be used for photodetector waveguide 49 or the waveguide could be defined by a selective area growth masking pattern also known in the art. Photodetector 40 is connected to DFB laser cavity 10 such that photodetector waveguide 49 is aligned and coextensive with DFB waveguide 14 and modulator waveguide 24.

Figure 7:
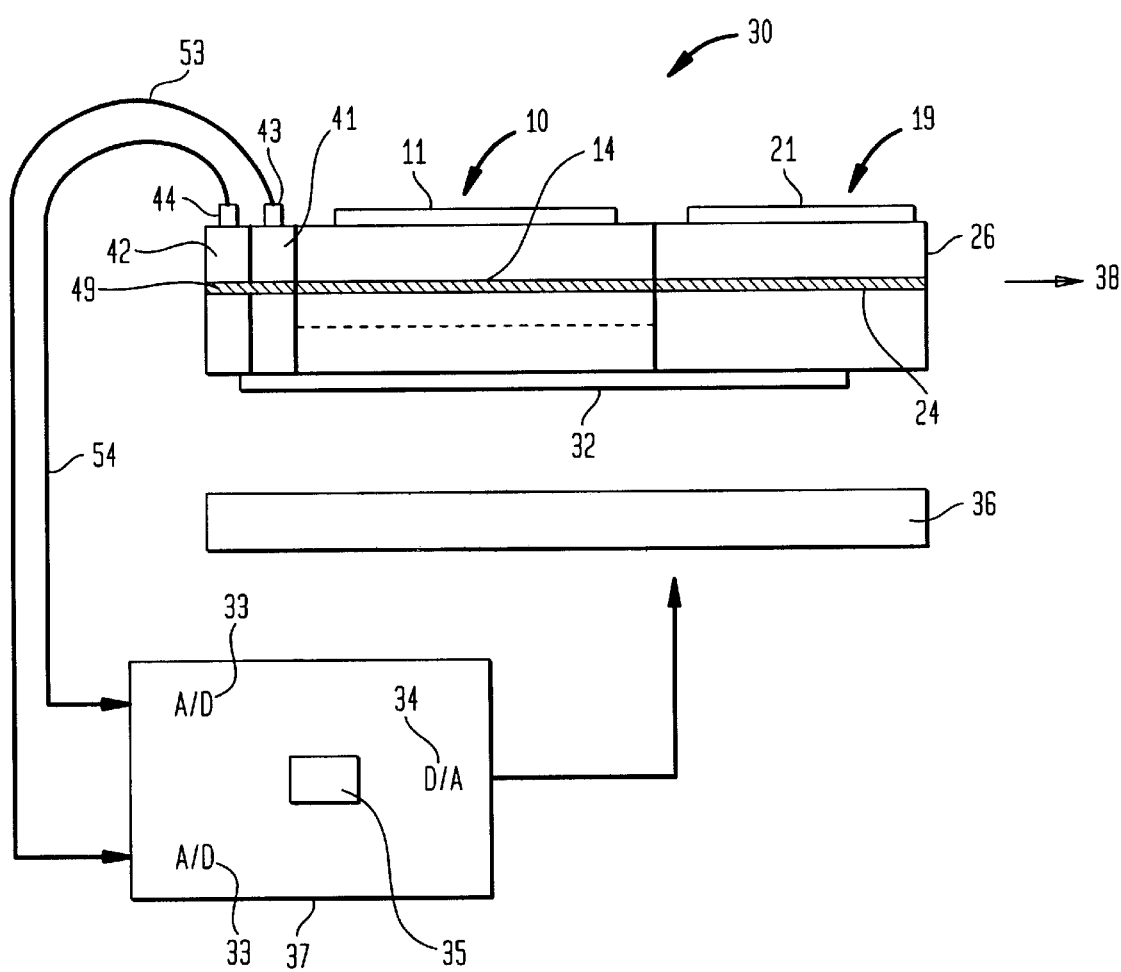
FIG. 7 is a schematic diagram of the monolithically integrated EML, and frequency discriminator of FIG. 3A connected to a controller.

First detector 41 also has a first detector signal connection 43 whereby a first detector output signal 53 as depicted, for example, in FIG. 7 may be input to discriminator electronics that can interpret frequency. Similarly, second detector 42 has a second detector signal connection 44 whereby second detector output signal 54 as depicted, for example, in FIG. 7 may be input to the same discriminator electronics as that connected to first detector 41. First detector 41 and second detector 42 may be provided with independent electrical contacts (not shown) which would allow individual bias voltages to be applied to the two detectors. This can be used to optimize the performance of EMFLD 30 as described below. Reference is now made to FIG. 7 which illustrates a connection from photodetector 40 to one type of discriminator electronics mentioned above. FIG. 7 depicts EMLFD 30 of FIG. 3A wherein first detector signal connection 43 and second detector signal connection 44 are connected to a controller 37. In a preferred embodiment controller 37 includes a microprocessor 35 and a control device 36 that controls temperature, voltage or current, such as, for example, a thermoelectric cooler 36. Microprocessor 35 includes analog to digital (A/V) converters 33 and a digital to analog (D/A) converter 34 as depicted in FIG. 7. Data is received and interpreted by microprocessor 35 (as described below) and then fed to a thermoelectric cooler 36 which is positioned in close proximity to EMLFD 30 such that it can change the operating temperature of EMLFD 30, in turn affecting the signals sent via first detector signal connection 43 and second detector signal connection 44 to controller 37 thereby forming a closed loop operational mode. As a result of this operation an EMLFD stabilized output signal 38 is produced from modulator front face 26.

Figure 4:
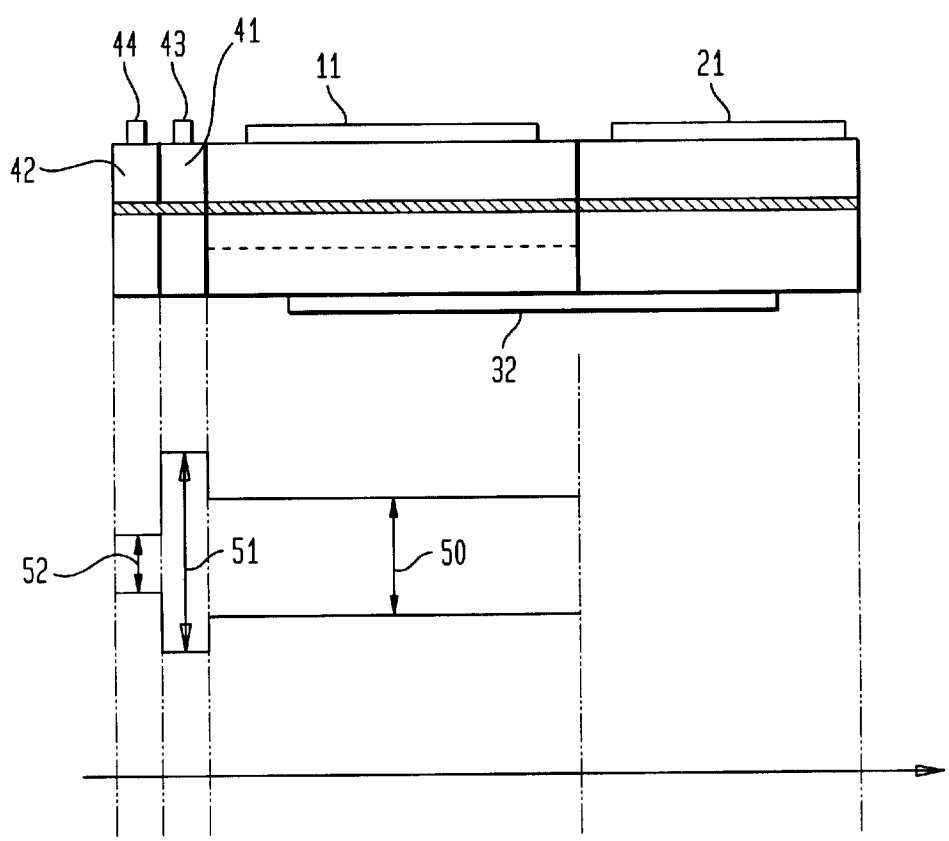
FIG. 4 is a schematic band diagram of the monolithically integrated EML, and frequency discriminator of FIG. 3A.
Figure 5:
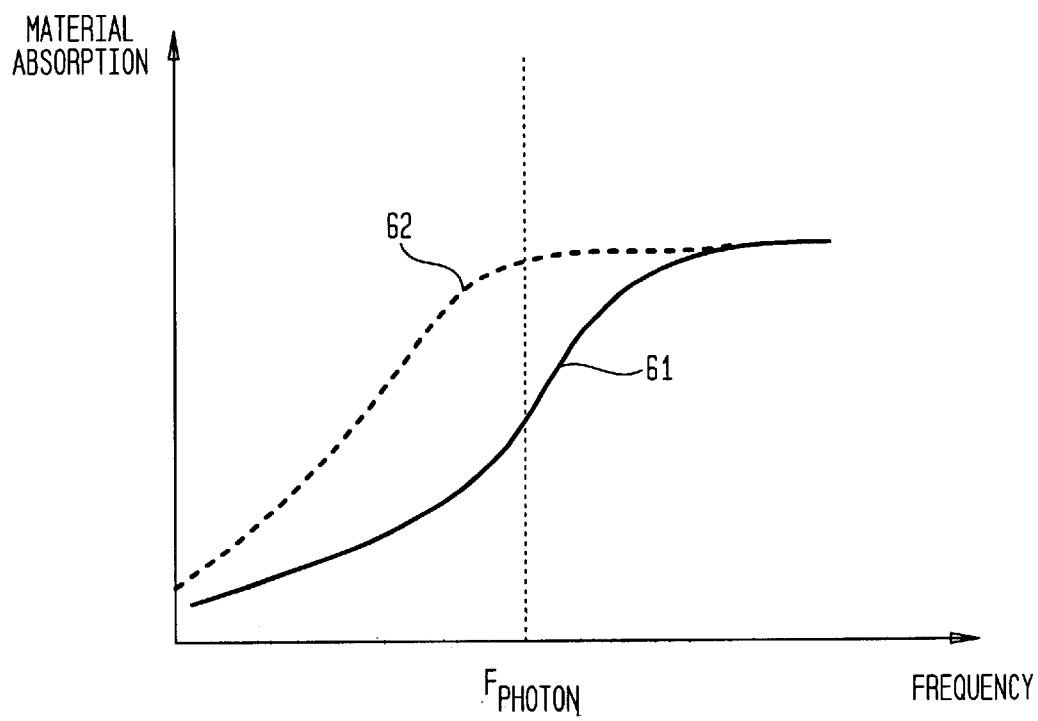
FIG. 5 is a graph showing the relationship between the material absorption and frequency of the two detectors forming the frequency discriminator of the monolithically integrated EML and frequency discriminator of FIG. 3A.
Figure 6:
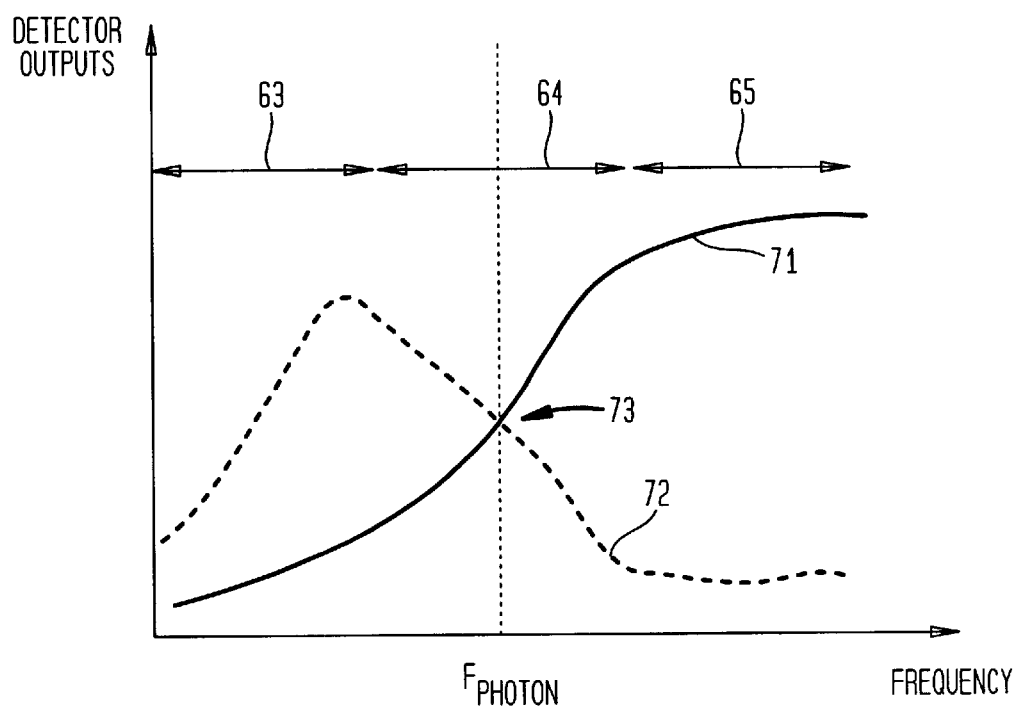
FIG. 6 is a graph showing the relationship between the detector outputs and frequency of the two detectors forming the frequency discriminator of the monolithically integrated EML and frequency discriminator of FIG. 3A.

Reference is now made to FIG. 4 which depicts a schematic band diagram of EMLFD 30, FIG. 5 which depicts the relationship between the material absorption and frequency of first detector 41 and second detector 42 and FIG. 6 which depicts the relationship between first detector output signal 53 and second detector output signal 54 and the frequency associated with first detector 41 and second detector 42.

In operation, light from DFB optical laser cavity 10 is injected into photodetector waveguide 49 at first detector 41. The relative responses of first detector 41 and second detector 42 can be adjusted by biasing second detector 42 at a different level as compared with first detector 41. The shift of the absorption edge of a MQW structure with electrical bias is well understood through the quantum confined Stark effect as known in the art. First detector 41 is electrically biased at a given level, for example 0 volts. Second detector 42 is electrically biased in such a way so as to enhance the sensitivity of second detector 42 to low energy photons by biasing it at −1 volt in the given example. Thus, first detector 41 will have a first detector bandgap energy 51, as shown in FIG. 4, which is slightly higher than EML photon energy 50 such that first detector 41 will tend to absorb light photons of a higher energy (i.e. higher frequency). Alternatively, second detector 42 will have a second detector bandgap energy 52, as shown in FIG. 4, which is slightly lower than EML, photon energy 50 such that second detector 42 will tend to absorb light photons of a lower energy (i.e. lower frequency). This relationship between the absorption capacities of first detector 41 and second detector 42 are also depicted in FIG. 5 wherein first detector absorption curve 61 of first detector 41 tends to absorb light photons having a frequency (and therefore energy) greater than a frequency $F_{photon}$ as shown in FIG. 5 wherein $f_{photon}$ represents the frequency of light photons entering photodetector waveguide 49 from DFB optical laser cavity 10. Alternatively, second detector absorption curve 62 of second detector 42 tends to absorb light photons having a frequency (and therefore energy) less than a frequency $F_{photon}$ as shown in FIG. 5.

First detector 41 modifies the spectrum of light that is incident from DFB optical laser cavity 10. This light is then transmitted on to second detector 42. Thus, the ratio of detector responses, i.e., first detector output signal 53 and second detector output signal 54, is a function of photon energy (or frequency, or wavelength). Referring now to FIG. 6, first detector output curve 71 depicts the relationship between first detector output signal 53 and the frequency (or energy) of light photons entering first detector 41. Similarly, second detector output curve 72 depicts the relationship between second detector output signal 54 and the frequency (or energy) of light photons entering first detector 42. FIG. 6 shows that for photons with a low frequency (or energy) there is very little absorption by first detector 41 and thus first detector output signal 53 is low. This is shown by first zone 63 wherein almost all photons pass through first detector 41 and reach second detector 42. Second detector 42 has a peak for second detector output signal 54 in first zone 63 showing that a large number of the photons that pass through first detector 41 are absorbed by second detector 42. It can also be seen that the output of second detector 42 begins rolling off towards the end of first zone 63 and continues to roll off during a second zone 64.

Second zone 64 represents a transition zone between the outputs of first detector 41 and second detector 42. Within second zone 64 some of the photons are absorbed by first detector 41 while others are absorbed by second detector 42. As the frequency (or energy) of the photons increases, a larger number of photons are absorbed by first detector 41 and at the same time a lower number of photons are absorbed by second detector 42. The output levels of first detector 41 and second detector 42 intersect at a cross over regime 73 which is the best operating point for EMFLD 30. As the frequency of the photons increases, the number of photons absorbed by first detector 41 increases with a corresponding decrease in the number of photons absorbed by second detector 42. Finally, in third zone 65 all the photons are absorbed by first detector 41 and none of the photons reach second detector 42. Clearly, light incident on second detector 42 has been modified by the transmissivity of first detector 41 which is positioned "upstream" (i.e. closer to the light source) of second detector 42. The responsivity of second detector 42 will be similar to that of first detector 41, but the actual response will be dependent upon the spectrum of light passing through first detector 41. The relative responses of first detector 41 and second detector 42 can be adjusted by biasing second detector 42 at a different level as compared to first detector 41 as explained in the example above wherein first detector 41 was biased at 0 volts whereas second detector 42 was biased at −1 volts.

Cross over regime 73 allows for the use of conventional techniques, well known in the art, to discriminate the optical frequency of EMLFD 30. For example, a desired optical frequency, or frequency range could be defined when first detector output signal 53 and second detector output signal 54 have a given predetermined ratio. This ratio would be inherently independent of incident power since both first detector 41 and second detector 42 are linear devices. In fact, first detector 41 could be used as a power monitor simultaneously with being used as a frequency discriminator, by connecting known power monitoring circuitry (not shown) to detector 41. The rate of change of response with the optical frequency of the discriminator, which would determine the slope of the discriminant signal, would depend upon the details of the structure of photodetector waveguide 49.

With continued reference to FIG. 7, first detector output signal 53 and second detector output signal 54 are then fed to controller 37 wherein the analog signals are converted into digital format. An algorithm is then formed to determine the operational frequency of EMLFD 30 which is compared with the desired operational frequency of EMLFD 30. The desired temperature of EMFLD 30 is calculated and the signal is then converted from digital to analog format and fed to thermoelectric cooler 36 which is positioned is close proximity to EMLFD 30. The signal from controller 37 to thermoelectric cooler 36 adjusts the temperature of thermoelectric cooler 36 which in turn adjusts the temperature of EMLFD 30 thereby changing the frequency of the photons in EMLFD 30. This temperature is adjusted until EMLFD 30 is operating so that first detector output curve 71 and second detector output curve 72 intersect at cross over regime 73. The algorithm used by controller 37 can consist of differencing, ratio or combination methods as known in the art and can use stored look-up tables to interpret frequency as a function of EMLFD 30 temperature. A variety of means can be used for controller 37. By way of non-limiting example a microprocessor may be used as controller 37. Controller 37 may also be a digital signal processor, general purpose computer, or other art recognized means for carrying out the functionality described herein.

Reference is now made to FIG. 31B which illustrates the optical cavity of a monolithically integrated EML and frequency discriminator (EMLFD) of a second embodiment of the present invention, generally indicated as 300. EMLFD 300 has a modulator 19 and a DFB optical cavity 10, as known in the prior art. Additionally, EMLFD 300 also has a two element photodetector 400. Photodetector 400 consists of a first detector 401 and a second detector 402. EMFLD 300 is grounded by an EMLFD ground connection 302.

DFB optical cavity 10 has a DFB back side 15 and a DFB front side 16. Modulator 19 has a modulator back side 25 and a modulator front side 26. First detector 401 has a first detector back side 405 and a first detector front side 406. Similarly, second detector 402 has a second detector back side 407 and a second detector front side 408. Photodetector 400 is formed such that first detector front side 406 of first detector 401 is connected to second detector back side 407 of second detector 402. This connection between first detector 401 and second detector 402 is one wherein the two detectors are electrically isolated from one another.

First detector back side 405 of first detector 401 is connected to DFB front side 16. Second detector front side 408 of second detector 402 is connected to modulator back side 25 of modulator 19.

DFB optical cavity 10 has a DFB waveguide 14, modulator 19 has a modulator waveguide 24, and photodetector 400 has a photodetector waveguide 409. The structure and function of DFB waveguide 14, modulator waveguide 24, and photodetector waveguide 409 is similar to that discussed above for the first embodiment of the present invention as depicted in FIG. 3A. First detector 401 also has a first detector signal connection 403 and second detector 402 similarly has a second detector signal connection 404. First detector signal connection 403 and second detector signal connector 404 operate and function in a manner similar to that discussed above for first detector signal connection 43 and second detector signal connection 44 in the first embodiment of the present invention as depicted in FIG. 3A.

Of course, while an EML is depicted as a preferred light source, the present invention can be configured in a variety of ways, with any of a variety of single frequency optical signal producing device being utilized, such as, by way of non-limiting example, DFB or DBR lasers, or any other art recognized single frequency light source. Moreover, the active region of the device could comprise a multiquantum well active region or bulk active material. Additionally, the sections of the device could be of the same or different material, and if the same could be formed by the Selective Area Growth (SAG) growth techniques known in the art. Moreover, the controller described herein could be a microprocessor, discrete analog or digital electronics or some combination thereof, or by application specific integrated circuit or general purpose computer, or thermoelectric cooler. Moreover the control signals, in addition to those described hereinabove, could be temperature based, current based or the like.

Thus, while there have been shown and described and pointed out fundamental novel features of the invention as applied to preferred embodiments thereof, it will be understood that various omissions and substitutions and changes in the form and details of the disclosed invention may be made by those skilled in the art without departing from the spirit of the invention. It is the intention, therefore, to be limited only as indicated by the scope of the claims appended hereto.

What is claimed is:

1. A frequency stable optical device comprising:
   a semiconductor light source for generating an optical signal at a frequency and having a first and second end;
   a frequency discriminator for detecting said frequency and having a first and second end and being monolithically formed at one of said first and said second ends of said light source;
   a modulator for modulating said light source and being monolithically formed at one of said other one of said first and said second ends of said light source and one of said first and said second ends of said frequency discriminator; and
   a controller connected to said frequency discriminator and said light source for receiving a frequency indicating signal from said frequency discriminator indicative of said frequency of said optical signal and for generating a control signal for controlling said light source so that said controller maintains said frequency of said optical signal within a desired frequency range based upon said frequency indicating signal.

2. The device according to claim 1, wherein said light source is an electro-absorption modulated laser.

3. The device according to claim 1, wherein said light source is a distributed feedback laser.

4. The device according to claim 1, wherein said light source is a distributed Bragg reflector laser.

5. The device according to claim 1, wherein said frequency discriminator comprises a photodetector.

6. The device according to claim 1, wherein said frequency discriminator comprises a photodetector array.

7. The device according to claim 1, wherein said controller comprises a microprocessor.

8. A frequency stable optical device comprising:
   a semiconductor light source having a back side, a front side and a light source waveguide extending from said back side to said front side;
   a modulator connected to said front side of said light source, said light source and said modulator forming an Electro-absorption Modulated Laser (EML), said EML having an output signal with an EML output frequency, said modulator including a modulator waveguide;
   a two element photodetector array connected to said back side of said light source such that said photodetector array detects said EML output frequency, said photodetector including a photodetector waveguide; and
   a controller connected to said photodetector array to maintain said EML output frequency within a predetermined frequency range.

9. The device of claim 8, wherein said light source is Distributed Feedback Laser (DFB) and said light source waveguide is a DFB waveguide.

10. The device of claim 9, wherein said photodetector waveguide, said DFB waveguide and said modulator waveguide are linearly aligned and coextensive and are constructed of the same material.

11. The device of claim 9, wherein at least one of said waveguides is a multiquantum well buried heterostructure.

12. The device of claim 9, wherein at least one of said waveguides is a bulk active material.

13. The device of claim 8 wherein said two element photodetector array comprises a first detector and a second detector, said first detector having an output signal characterized by a first detector output curve, said second detector having an output signal characterized by a second detector output curve, said first detector output curve and said second detector output curve intersecting at a cross over regime, said cross over regime defining a predetermined preferred operating point of said monolithically integrated EML and frequency discriminator.

14. A method for maintaining a frequency of an optical source within a predetermined frequency range, the method comprising the steps of:
   monolithically integrating a single frequency light source and a photodetector waveguide;
   transmitting light from said light source into said photodetector waveguide at a first detector;
   absorbing a first amount of said light by said first detector, said first detector transmitting a first detector output signal to a controller;
   transmitting remaining light to a second detector;
   absorbing a second amount of said remaining light by said second detector, said second detector transmitting a second detector output signal to said controller;
   comparing said first detector output signal and said second detector output signal in said controller; and
   adjusting said optical source frequency by said controller to maintain said frequency within said predetermined frequency range.

15. The method of claim 14, wherein said method is performed using a Distributed Feedback Laser as said light source.

16. The method of claim 14 wherein said photodetector waveguide is a multiquantum well buried heterostructure.

17. The method of claim 14 wherein said photodetector waveguide is a bulk active material.

18. The method of claim 14 wherein said controller comprises a microprocessor for receiving said output signals and producing a microprocessor output signal in response thereto, and a control device connected to and responsive to said microprocessor output signal and in close proximity to said optical source.

19. A monolithically integrated EML and frequency discriminator comprising:

a DFB laser having a back side, a front side and a DFB waveguide extending from said back side to said front side;

a photodetector array having a first detector and a second detector, said first detector having a first detector back side and a first detector front side, said second detector having a second detector back side and a second detector front side, said first detector back side being connected to said front side of said DFB laser such that said photodetector array detects said EML output frequency, said first detector front side being connected to said second detector back side, said photodetector including a photodetector waveguide;

a modulator connected to said second detector front side of said second detector, said DFB laser and said modulator forming an EML, said EML having an output signal with an EML output frequency, said modulator including a modulator waveguide; and a controller connected to said photodetector array to maintain said EML output frequency within a predetermined range.

20. The monolithically integrated EML and frequency discriminator of claim 19, wherein said photodetector waveguide, said DFB waveguide and said modulator waveguide are linearly aligned and coextensive and are constructed of the same material.

21. The monolithically integrated EML and frequency discriminator of claim 19, wherein at least one of said waveguides is a multiquantum well buried heterostructure.

22. The monolithically integrated EML and frequency discriminator of claim 19, wherein at least one of said waveguides is a bulk active material.

23. The monolithically integrated EML and frequency discriminator of claim 19, wherein said controller comprises a microprocessor and a control device.

24. The monolithically integrated EML, and frequency discriminator of claim 19, wherein said two element photodetector array comprises a first detector and a second detector, said first detector having an output characteristic characterized by a first detector output curve, said second detector having an output characteristic characterized by a second detector output curve, said first detector output curve and said second detector output curve intersecting at a cross over regime, said cross over regime defining a predetermined preferred operating point of said monolithically integrated EML and frequency discriminator.

25. A frequency stable optical device comprising:

a single frequency light source having a light source waveguide extending therethrough;

a modulator having a modulator waveguide extending therethrough, said single frequency light source and said modulator forming an Electro-absorption Modulated Laser (EML) having an output signal with an EML output frequency;

a two element photodetector array having a first detector and a second detector and disposed between said single frequency light source and said modulator and detecting said EML output frequency, said photodetector including a photodetector waveguide; and a controller connected to said two element photodetector array to maintain said EML output frequency within a predetermined frequency range.

26. The device of claim 25, wherein said light source is a Distributed Feedback Laser (DFB) and said light source waveguide is a DFB waveguide.

27. The device of claim 26 wherein said photodetector waveguide, said DFB waveguide and said modulator waveguide are linearly aligned and coextensive and are constructed of the same material.

28. The device of claim 26, wherein at least one of said waveguides is a multiquantum well buried heterostructure.

29. The device of claim 26, wherein at least one of said waveguides is a bulk active material.

30. The device of claim 25 wherein said two element photodetector array comprises said first detector and said second detector, said first detector having an output characteristic characterized by a first detector output curve, said second detector having an output characteristic characterized by a second detector output curve, said first detector output curve and said second detector output curve intersecting at a cross over regime, said cross over regime defining a predetermined preferred operating point of said monolithically integrated EML and frequency discriminator.

* * * * *